(12) United States Patent
Hwang et al.

(10) Patent No.: US 9,704,732 B2
(45) Date of Patent: Jul. 11, 2017

(54) APPARATUSES FOR BONDING SEMICONDUCTOR CHIPS

(75) Inventors: Yisung Hwang, Asan-si (KR);
Jungchul Lee, Cheonan-si (KR);
Jaehong Kim, Asan-si (KR);
Taegyeong Chung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 803 days.

(21) Appl. No.: 13/599,548

(22) Filed: Aug. 30, 2012

(65) Prior Publication Data

US 2013/0160952 A1 Jun. 27, 2013

(30) Foreign Application Priority Data

Dec. 23, 2011 (KR) .................. 10-2011-0141130

(51) Int. Cl.
*H01L 21/46* (2006.01)
*H01L 21/58* (2006.01)
(Continued)

(52) U.S. Cl.
CPC ...... *H01L 21/67144* (2013.01); *H01L 2924/0002* (2013.01); *Y10T 156/1744* (2015.01)

(58) Field of Classification Search
CPC ................................................. H01L 21/67144
See application file for complete search history.

(56) References Cited

U.S. PATENT DOCUMENTS

| 4,725,182 A | * | 2/1988 | Sakamoto et al. ....... 414/331.02 |
| 5,803,932 A | * | 9/1998 | Akimoto ........... H01L 21/67173 |
| | | | 118/500 |

(Continued)

FOREIGN PATENT DOCUMENTS

| CN | 101071759 A | 11/2007 |
| CN | 102290486 A | 12/2011 |

(Continued)

OTHER PUBLICATIONS

Machine translation of JP 2006-186113 (Jul. 2006) performed by J-Plat Pat.*

*Primary Examiner* — Mark A Osele
(74) *Attorney, Agent, or Firm* — Harness, Dickey & Pierce, P.L.C.

(57) ABSTRACT

An apparatus for bonding semiconductor chips may comprise transfer rails configured to transfer substrates, loading members configured to load the substrates onto the transfer rails, unloading members configured to unload the substrates from the transfer rails, a first wafer supply unit configured to supply a first wafer including semiconductor chips, and/or a bonding unit configured to bond the semiconductor chips to the substrates. An apparatus for bonding semiconductor chips may comprise a transfer rail configured to transfer substrates, loading members configured to load the substrates onto the transfer rail, unloading members configured to unload the substrates from the transfer rail, a buffer member at a side of the transfer rail configured to temporarily receive the substrates loaded by the loading members, a first wafer supply unit configured to supply a first wafer including semiconductor chips, and/or a bonding unit configured to bond the semiconductor chips to the substrates.

20 Claims, 6 Drawing Sheets

(51) Int. Cl.
  *B65H 29/00* (2006.01)
  *H01L 21/67* (2006.01)

(56) References Cited

U.S. PATENT DOCUMENTS

| | | |
|---|---|---|
| 6,170,736 B1 | 1/2001 | Briehl et al. |
| 6,344,401 B1 | 2/2002 | Lam |
| 6,722,412 B2 * | 4/2004 | Huang et al. ............... 156/499 |
| 6,863,109 B2 * | 3/2005 | Kim et al. ............... 156/556 |
| 7,074,646 B2 | 7/2006 | Kim et al. |
| 7,374,966 B2 | 5/2008 | Kim et al. |
| 7,437,818 B2 * | 10/2008 | Kabeshita et al. ............ 29/832 |
| 7,557,565 B2 | 7/2009 | Kim |
| 8,240,541 B2 * | 8/2012 | Lyu ............... 228/33 |
| 8,546,802 B2 * | 10/2013 | Hwang et al. ............... 257/48 |
| 8,738,174 B2 | 5/2014 | You et al. |
| 8,991,681 B2 * | 3/2015 | Maki et al. ............... 228/180.1 |
| 2001/0040197 A1 * | 11/2001 | Sekiya et al. ............... 241/101.4 |
| 2003/0145939 A1 | 8/2003 | Ahn et al. |
| 2004/0108582 A1 | 6/2004 | Kim et al. |
| 2005/0106778 A1 | 5/2005 | Kim et al. |
| 2006/0266792 A1 | 11/2006 | Ko et al. |
| 2008/0157316 A1 | 7/2008 | Yang |
| 2011/0232082 A1 * | 9/2011 | Kim et al. ............... 29/740 |
| 2013/0167369 A1 * | 7/2013 | Oh et al. ............... 29/740 |

FOREIGN PATENT DOCUMENTS

| | | |
|---|---|---|
| CN | 203367255 U | 12/2013 |
| JP | S6022834 A | 2/1985 |
| JP | H07193093 A | 7/1995 |
| JP | H098068 A | 1/1997 |
| JP | 2004311938 A | 11/2004 |
| JP | 2006186113 A | 7/2006 |
| JP | 2011018733 A | 1/2011 |
| JP | 2011-066368 A | 3/2011 |
| KR | 102000003647 A | 7/2000 |
| KR | 10-2003-0009627 A | 2/2003 |
| KR | 10-0415282 B1 | 1/2004 |
| KR | 10-0484088 B1 | 4/2005 |
| KR | 100634869 B1 | 10/2006 |
| KR | 10-2007-0037824 A | 4/2007 |

* cited by examiner

APPARATUSES FOR BONDING SEMICONDUCTOR CHIPS

CROSS-REFERENCE TO RELATED APPLICATION(S)

This application claims priority from Korean Patent Application No. 10-2011-0141130, filed on Dec. 23, 2011, in the Korean Intellectual Property Office (KIPO), the entire contents of which are incorporated herein by reference.

BACKGROUND

1. Field

Example embodiments may relate to apparatuses for bonding semiconductor chips. Example embodiments also may relate apparatuses for bonding semiconductor chips on substrates such as printed circuit boards and/or lead frames.

2. Description of Related Art

Generally, semiconductor devices may be manufactured through a fabrication (FAB) process forming a pattern according to characteristics of the semiconductor devices on a wafer, an electric die sorting (EDS) process testing electrical characteristics of the pattern formed on the wafer, and a packaging process manufacturing individual chips from the wafer. A die bonding process of the packaging process means a process that divides the wafer into dies and bonds the divided die on a substrate such as a lead frame or a printed circuit board.

SUMMARY

Some example embodiments may provide apparatuses for bonding semiconductor chips capable of improving productivity of die bonding processes.

In some example embodiments, an apparatus for bonding semiconductor chips may comprise transfer rails configured to transfer substrates, loading members configured to load the substrates onto the transfer rails, unloading members configured to unload the substrates from the transfer rails, a first wafer supply unit configured to supply a first wafer including first semiconductor chips, and/or a bonding unit configured to bond the first semiconductor chips to the substrates.

In some example embodiments, each of the loading members and each of the unloading members may make a pair. Each pair may be adjacent to an end of the transfer rails.

In some example embodiments, each of the loading members may be adjacent to a first end of the transfer rails. Each of the unloading members may be adjacent to a second end of the transfer rails.

In some example embodiments, the loading members may be configured to load different kinds of the substrates onto the transfer rails. The first semiconductor chips may be classified according to characteristics of the first semiconductor chips. The bonding unit may be further configured to bond the classified first semiconductor chips to the different kinds of the substrates.

In some example embodiments, the loading members may be further configured to load a same kind of the substrates onto the transfer rails. When the bonding unit bonds the first semiconductor chips to the substrates loaded on a first one of the transfer rails, the substrate loaded on a second one of the transfer rails may be standing by ready.

In some example embodiments, the apparatus may further comprise a second wafer supply unit configured to supplying a second wafer including second semiconductor chips. The loading members may be further configured to load a same kind of the substrates onto the transfer rails. The bonding unit may be further configured to stack the first semiconductor chips and the second semiconductor chips on the substrates.

In some example embodiments, the apparatus may further comprise a second wafer supply unit configured to supplying a second wafer including second semiconductor chips. The loading members may be further configured to load different kinds of the substrates onto the transfer rails. The first semiconductor chips may be classified according to characteristics of the first semiconductor chips. The bonding unit may be further configured to bond the classified first semiconductor chips to the different kinds of the substrates, and then the bonding unit may be further configured to bond the second semiconductor chips to the first semiconductor chips.

In some example embodiments, an apparatus for bonding semiconductor chips may comprise a transfer rail configured to transfer substrates, loading members configured to load the substrates onto the transfer rail, unloading members configured to unload the substrates from the transfer rail, a buffer member at a side of the transfer rail, the buffer member configured to temporarily receive the substrates loaded by the loading members, a first wafer supply unit configured to supply a first wafer including first semiconductor chips, and/or a bonding unit configured to bond the first semiconductor chips to the substrates.

In some example embodiments, the loading members may be adjacent to a first end of the transfer rail. The unloading members may be adjacent to a second end of the transfer rail.

In some example embodiments, the loading members may be configured to load different kinds of the substrates onto the transfer rail. The first semiconductor chips may be classified according to characteristics of the first semiconductor chips. When the bonding unit bonds one of the classified first semiconductor chips to a first kind of the substrates, the buffer member may be further configured to temporarily receive a second kind of the substrates.

In some example embodiments, the apparatus may further comprise a second wafer supply unit configured to supply a second wafer including second semiconductor chips. The loading members may be further configured to load a same kind of the substrates onto the transfer rail. The bonding unit may be further configured to stack the first semiconductor chips and the second semiconductor chips on the substrates.

In some example embodiments, an apparatus for bonding semiconductor chips may comprise a first transfer rail configured to transfer a first substrate, a first loading member configured to load the first substrate onto the first transfer rail, a first unloading member configured to unload the first substrate from the first transfer rail, a second transfer rail configured to transfer a second substrate, a second loading member configured to load the second substrate onto the second transfer rail, a second unloading member configured to unload the second substrate from the second transfer rail, a first wafer supply unit configured to supply a first wafer including first semiconductor chips, and/or a bonding unit configured to bond the first semiconductor chips to the first substrate and the second substrate.

In some example embodiments, the first transfer rail and the second transfer rail may be arranged in a line. The first loading member and the first unloading member may make a pair on an opposite side of the second transfer rail with the first transfer rail as a center. The second loading member and the second unloading member may make a pair on an opposite side of the first transfer rail with the second transfer rail as a center.

In some example embodiments, the first transfer rail and the second transfer rail may be parallel to each other. The first loading member may be adjacent to a first end of the first transfer rail. The first unloading member may be adjacent to a second end of the first transfer rail. The second loading member may be adjacent to a first end of the second transfer rail. The second unloading member may be adjacent to a second end of the second transfer rail.

In some example embodiments, the apparatus may further comprise a second wafer supply unit configured to supply a second wafer including second semiconductor chips. The bonding unit may be further configured to bond the second semiconductor chips to the first semiconductor chips.

In some example embodiments, an apparatus for bonding semiconductor chips may comprise first and second transfer rails configured to transfer substrates, a first loading member configured to load the substrates onto the first transfer rail, a second loading member configured to load the substrates onto the second transfer rail, a first unloading member configured to unload the substrates from the first transfer rail, a second unloading member configured to unload the substrates from the second transfer rail, a first wafer supply unit configured to supply a first wafer including first semiconductor chips, and/or a bonding unit configured to bond the first semiconductor chips to the substrates.

In some example embodiments, the first transfer rail and the second transfer rail may be in line with each other.

In some example embodiments, the first loading member and the first unloading member may be near a same end of the first transfer rail.

In some example embodiments, the second loading member and the second unloading member may be near a same end of the second transfer rail.

In some example embodiments, the first transfer rail and the second transfer rail may be parallel to each other.

In some example embodiments, the first loading member and the first unloading member may be near opposite ends of the first transfer rail.

In some example embodiments, the second loading member and the second unloading member may be near opposite ends of the second transfer rail.

In some example embodiments, the apparatus may further comprise a second wafer supply unit configured to supply a second wafer including second semiconductor chips. The bonding unit may be further configured to bond the second semiconductor chips to the first semiconductor chips.

In some example embodiments, the apparatus may further comprise a second wafer supply unit configured to supply a second wafer including second semiconductor chips. The bonding unit may be further configured to stack the first semiconductor chips and the second semiconductor chips on the substrates.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
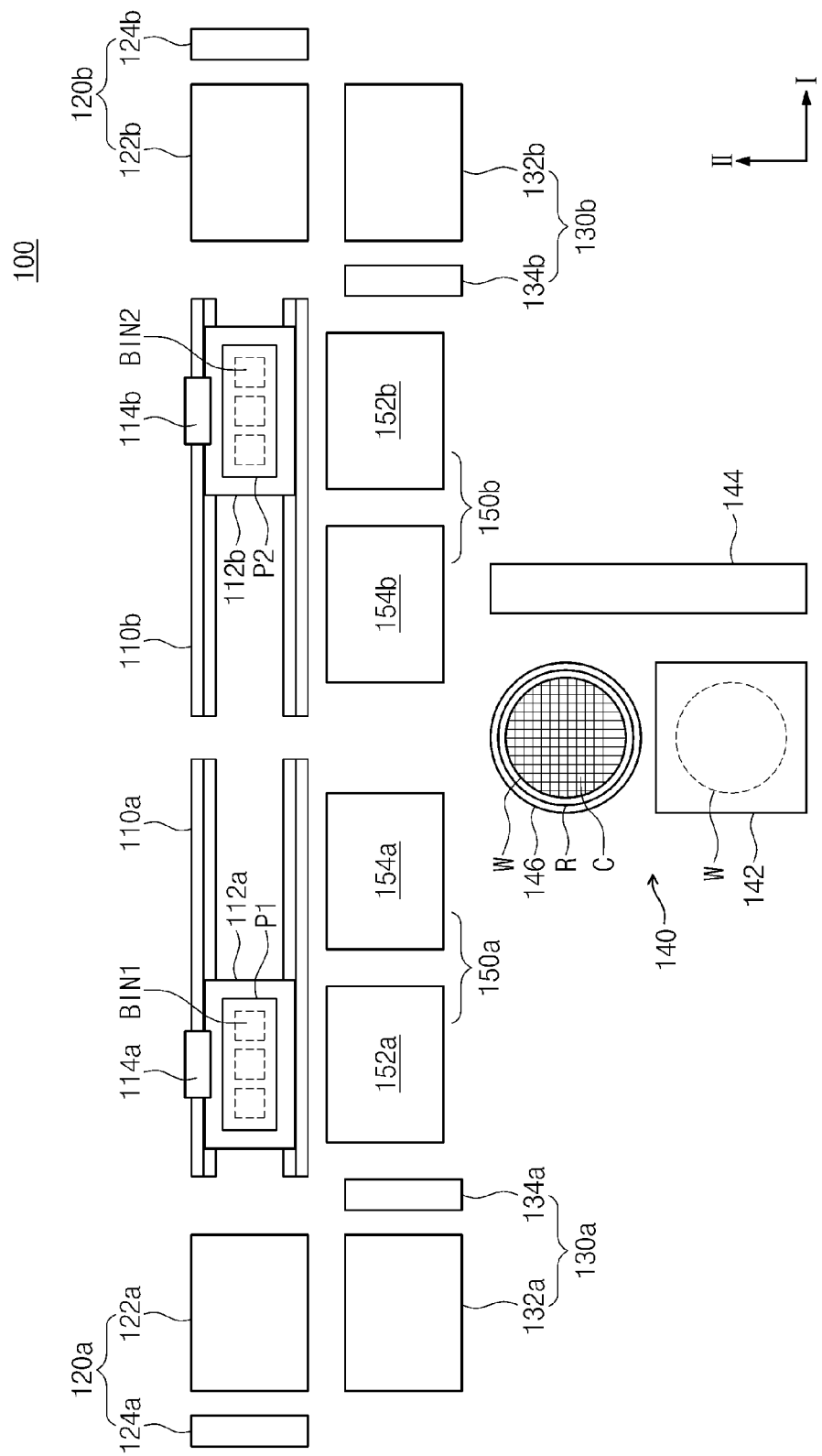
FIG. 1 is a plan view illustrating an apparatus for bonding a semiconductor chip according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

First Embodiment

FIG. 1 is a plan view illustrating an apparatus 100 for bonding a semiconductor chip according to some example embodiments. Referring to FIG. 1, an apparatus 100 for bonding a semiconductor chip includes first and second transfer rails 110a and 110b, first and second loading members 120a and 120b, first and second unloading members 130a and 130b, a first wafer supply unit 140, and first and second bonding units 150a and 150b.

Longitudinal directions of the first and second transfer rails 110a and 110b are parallel to a first direction I. The first and second transfer rails 110a and 110b may be arranged along the first direction I and be spaced apart from each other. First and second shuttles 112a and 112b, on which first and second substrates P1 and P2 are set, may be provided to the first and second transfer rails 110a and 110b, respectively. The first and second shuttles 112a and 112b may be linearly moved in the first direction I or a direction opposite to the first direction I by first and second transfer grippers 114a and 114b respectively disposed on the first and second transfer rails 110a and 110b.

The first loading member 120a loads the first substrate P1 on the first transfer rail 110a, and the first unloading member 130a unloads the first substrate P1 from the first transfer rail 110a. The first loading member 120a and the first unloading member 130a may make a pair and be disposed at a side of the first transfer rail 110a. For example, the first loading member 120a and the first unloading member 130a may be disposed on the opposite side of the second transfer rail 110b with the first transfer rail 110a as the center. And the first loading member 120a and the first unloading member 130a may be spaced apart from each other in a second direction II perpendicular to the first direction I.

The first loading member 120a includes a first supply container 122a and a first loader 124a. The first supply container 122a receives the first substrates P1. Semiconductor chips will be bonded on the first substrate P1. The first loader 124a sequentially loads the first substrates P1 from the first supply container 122a onto the first transfer rail 110a. The first unloading member 130a includes a first receiving container 132a and a first unloader 134a. The first receiving container 132a receives the first substrates P1 on which the semiconductor chips are bonded. The first unloader 134a unloads the first substrates P1 having the bonded semiconductor chips from the first transfer rail 110a and then the first unloader 134a loads the first substrate P1 having the bonded semiconductor chips into the first receiving container 132a.

The second loading member 120b loads the second substrate P2 on the second transfer rail 110b, and the second unloading member 130b unloads the second substrate P2 from the second transfer rail 110b. The second loading member 120b and the second unloading member 130b may make a pair and be disposed at a side of the second transfer rail 110b. For example, the second loading member 120b and the second unloading member 130b may be disposed on the opposite side of the first transfer rail 110a with the second transfer rail 110b as the center. Elements of the second loading member 120b and the second unloading member 130b may be the same as the elements of the first loading member 120a and the first unloading member 130a. Thus, detailed descriptions of the second loading member 120b and the second unloading member 130b will be omitted. Here, a reference numeral 122b is a second supply container, a reference numeral 124b is a second loader, a reference numeral 132b is a second receiving container, and a reference numeral 134b is a second unloader in FIG. 1.

The first wafer supply unit 140 supplies a wafer W including semiconductor chips C. The first wafer supply unit 140 may include a first wafer cassette 142, a transfer robot 144, and a first tape expander 146. The first wafer cassette 142 may be set on a cassette supporter (not shown). The wafer W is received inside the first wafer cassette 142. The wafer W may be a wafer on which a FAB process, an EDS process, a back grinding process, and a sawing process may be performed. In other words, an ultraviolet tape for dicing may be bonded to a backside of the wafer W. An edge of the wafer W may be supported by a wafer ring R. The transfer robot 144 may withdraw the wafer W from the first wafer cassette 142 and then the transfer robot 144 may dispose the wafer on the first tape expander 146. For easily picking up the semiconductor chip C disposed on the wafer W, the first tape expander 146 may expand the wafer ring R in order to extend the ultraviolet tape for dicing.

The first bonding unit 150a bonds the semiconductor chips C to the first substrates P1. The first bonding unit 150a may include a first adhesive supplier 152a and a first die bonding tool 154a. The first adhesive supplier 152a and the first die bonding tool 154a may be disposed at a side of the first transfer rail in a line. The first adhesive supplier 152a supplies an adhesive to the first substrates P1 transferred by the first transfer rail 110a. The adhesive may be a conductive liquid adhesive such as silver-epoxy and/or silver-glass. The first die bonding tool 154a picks up the semiconductor chip C from the wafer W disposed on the first tape expander 146 and moves the semiconductor chip C onto the adhesive on the first substrate P1. And then the first die bonding tool 154a supplies pressure to the semiconductor chip C on the adhesive on the first substrate P1 so as to bond the semiconductor chip C to the first substrate P1. In the present embodiment, the semiconductor chips C may be bonded to the first substrate P1 by the adhesive. However, example embodiments are not limited thereto. In other embodiments, the semiconductor chips C may be bonded to the first substrates P1 by an adhesive tape.

The second bonding unit 150b bonds the semiconductor chips C to the second substrates P2 transferred by the second transfer rail 110b. Elements of the second bonding unit 150b may be the same as the elements of the first bonding unit 150a. Thus, detailed descriptions for the elements of the second bonding unit 150b will be omitted. Here, a reference numeral 152b is a second adhesive supplier and a reference numeral 154b is a second die bonding tool in FIG. 1.

As described above, the first wafer supply unit 140 supplies the wafer W on which an electrical characteristic test (e.g. the EDS process) is performed. When the EDS process is performed, the semiconductor chips on the wafer W are classified into failed semiconductor chips and good semiconductor chips. Additionally, the good semiconductor chips may be classified into grades different from each other according to the tested electrical characteristics.

The apparatus for bonding the semiconductor chip according to some example embodiments may classify the good semiconductor chips according to the tested grades and bond the classified good semiconductor chips to substrates different from each other, respectively. This will be described in more detail. For the purpose of ease and convenience in explanation, the good semiconductor chips C may be classified into first chips BIN1 and second chips BIN2 according to the tested electrical characteristics.

The first loader 124a loads the first substrates P1 loaded in the first supply container 122a onto the first shuttle 112a disposed on the first transfer rail 110a. The second loader 124b loads the second substrates P2 loaded in the second supply container 122b onto the second shuttle 112b disposed on the second transfer rail 110b.

The first adhesive supplier 152a supplies the adhesive to the first substrates P1 loaded on the first shuttle 112a. The second adhesive supplier 152b supplies the adhesive to the second substrates P2 loaded on the second shuttle 112b.

The first transfer gripper 114a moves the first shuttle 112a on the first transfer rail 110a in the first direction I. The second transfer gripper 114b moves the second shuttle 112b on the second transfer rail 110b in the direction opposite to the first direction I.

The first die bonding tool 154a picks up the first chips BIN1 from the wafer W and moves the first chips BIN1 onto the adhesive on the first substrate P1. And then the first die bonding tool 154a supplies pressure to the first chips BIN1 on the adhesive on the first substrates P1 so as to bond the first chips BIN1 to the first substrates P1. The second die bonding tool 154b picks up the second chips BIN2 from the wafer W and moves the second chips BIN2 onto the adhesive on the second substrates P2. And then the second die bonding tool 154b supplies pressure to the second chips BIN2 on the adhesive on the second substrates P2 so as to bond the second chips BIN2 to the second substrates P2.

Subsequently, the first transfer gripper 114a moves the first shuttle 112a in the direction opposite to the first direction I. The second transfer gripper 114b moves the second shuttle 112b in the first direction I.

The first unloader 134a unloads the first substrates P1 having the bonded first chips BIN1 from the first transfer rail 110a and then loads the first substrate P1 into the first receiving container 132a. The second unloader 134b unloads the second substrates P2 having the bonded second chips BIN2 from the second transfer rail 110b and then loads the second substrate P2 into the second receiving container 132b.

The first chips BIN1 bonded to the first substrates P1 and the second chips BIN2 bonded to the second substrates P2 may be formed into different kinds of packages by a subsequent packaging process. The different kinds of packages may be applied suitably for uses thereof.

Second Embodiment

Figure 2:
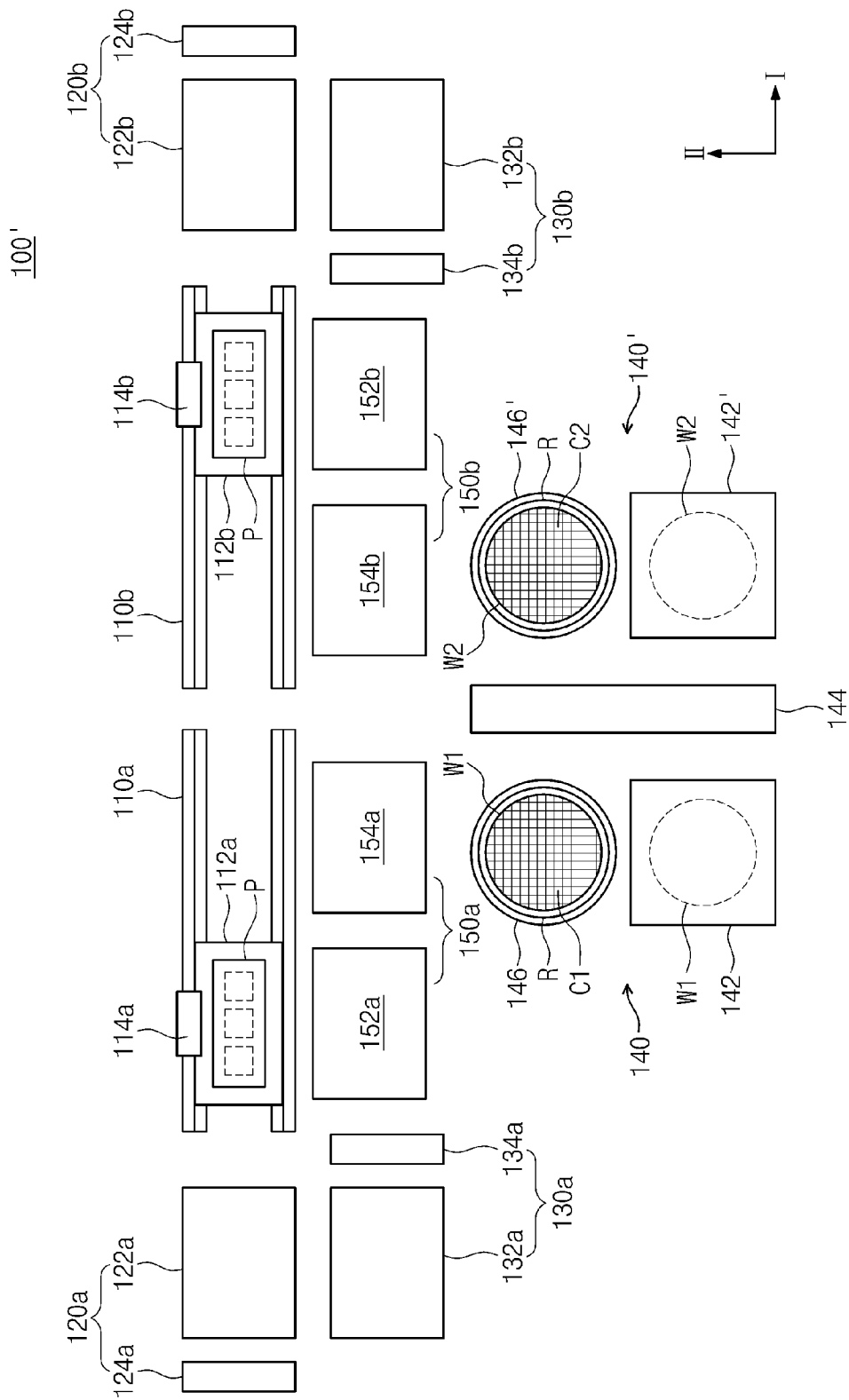
FIG. 2 is a plan view illustrating an apparatus for bonding a semiconductor chip according to some example embodiments.

FIG. 2 is a plan view illustrating an apparatus 100' for bonding a semiconductor chip according to some example embodiments. Hereinafter, for the purpose of the ease and convenience in explanation, the descriptions of the same elements as the apparatus 100 illustrated in FIG. 1 will be omitted or mentioned briefly.

Referring to FIG. 2, the first wafer supply unit 140 supplies a first wafer W1 including first semiconductor chips C1 and a second wafer supply unit 140' supplies a second wafer W2 including second semiconductor chips C2.

The second wafer supply unit 140' may include a second wafer cassette 142' and a second tape expander 146'. The second wafer cassette 142' may be set on a cassette supporter (not shown). The second wafer W2 is received inside the second wafer cassette 142'. The second wafer W2 may be withdrawn from the second wafer cassette 142' and then be set on the second tape expander 146' by the transfer robot 144. For easily picking up the second semiconductor chip C2 disposed on the second wafer W2, the second tape expander 146' may expand a wafer ring R in order to extend an ultraviolet tape for dicing.

The apparatus 100' for bonding the semiconductor chip may load the same kind of substrates P onto the first and second transfer rails 110a and 110b and then the apparatus 100' may stack the first semiconductor chips C1 and the second semiconductor chips C2 on the substrates P. This will be described in more detail.

The first loader 124a loads the substrates P disposed in the first supply container 122a onto the first shuttle 112a on the first transfer rail 110a. The second loader 124b loads the substrates P disposed in the second supply container 122b onto the second shuttle 112b on the second transfer rail 110b.

The first adhesive supplier 152a supplies the adhesive to the substrates P loaded on the first shuttle 112a. The second adhesive suppler 152b supplies the adhesive to the substrates P loaded on the second shuttle 112b.

The first transfer gripper 114a moves the first shuttle 112a on the first transfer rail 110a in the first direction I. The second transfer gripper 114b moves the second shuttle 112b on the second transfer rail 110b in the direction opposite to the first direction I.

The first and second die bonding tools 154a and 154b pick up the first semiconductor chips C1 from the first wafer W1 and move the first semiconductor chips C1 onto the adhesive on the substrates P. And then the first and second die bonding tools 154a and 154b supply pressure to the first semiconductor chips C1 so as to bond the first semiconductor chips C1 to the substrates P.

The first transfer gripper 114a moves the first shuttle 112a on the first transfer rail 110a in the direction opposite to the first direction I. The second transfer gripper 114b moves the second shuttle 112b on the second transfer rail 110b in the first direction I.

Subsequently, the first adhesive supplier 152a supplies the adhesive to the first semiconductor chips C1 on the substrates P loaded on the first shuttle 112a. The second adhesive supplier 152b supplies the adhesive to the first semiconductor chips C1 on the substrates P loaded on the second shuttle 112b.

The first transfer gripper 114a moves the first shuttle 112a on the first transfer rail 110a in the first direction I. The second transfer gripper 114b moves the second shuttle 112b on the second transfer rail 110b in the direction opposite to the first direction I.

The first and second die bonding tools 154a and 154b pick up the second semiconductor chips C2 from the second wafer W2 and move the second semiconductor chips C2 onto the adhesive on the first semiconductor chips C1. And then the first and second die bonding tools 154a and 154b supply pressure to the second semiconductor chips C2 on the adhesive on the first semiconductor chips C1 so as to stack the second semiconductor chips C2 on the first semiconductor chips C1.

Subsequently, the first transfer gripper 114a moves the first shuttle 112a in the direction opposite to the first direction I. The second transfer gripper 114b moves the second shuttle 112b in the first direction I.

The first unloader 134a unloads the substrates P having the stacked first and second semiconductor chips C1 and C2 from the first transfer rail 110a and then the first unloader 134a loads the substrates P into the first receiving container 132a. The second unloader 134b unloads the substrates P having the stacked first and second semiconductor chips C1 and C2 from the second transfer rail 110b and then the second unloader 134b loads the substrates P into the second receiving container 132b.

Alternatively, the apparatus 100' for bonding the semiconductor chip may load different kinds of substrates onto the first and second transfer rails 110a and 110b, respectively. Subsequently, the apparatus 100' may classify the first semiconductor chips C1 of the first wafer W1 according to characteristics thereof. And then the apparatus 100' may bond the classified first semiconductor chips C1 to the different kinds of the substrates, respectively. Subsequently, the apparatus 100' may stack the second semiconductor chips C2 of the second wafer W2 on the first semiconductor chips C1 bonded to the substrates.

Third Embodiment

Figure 3:
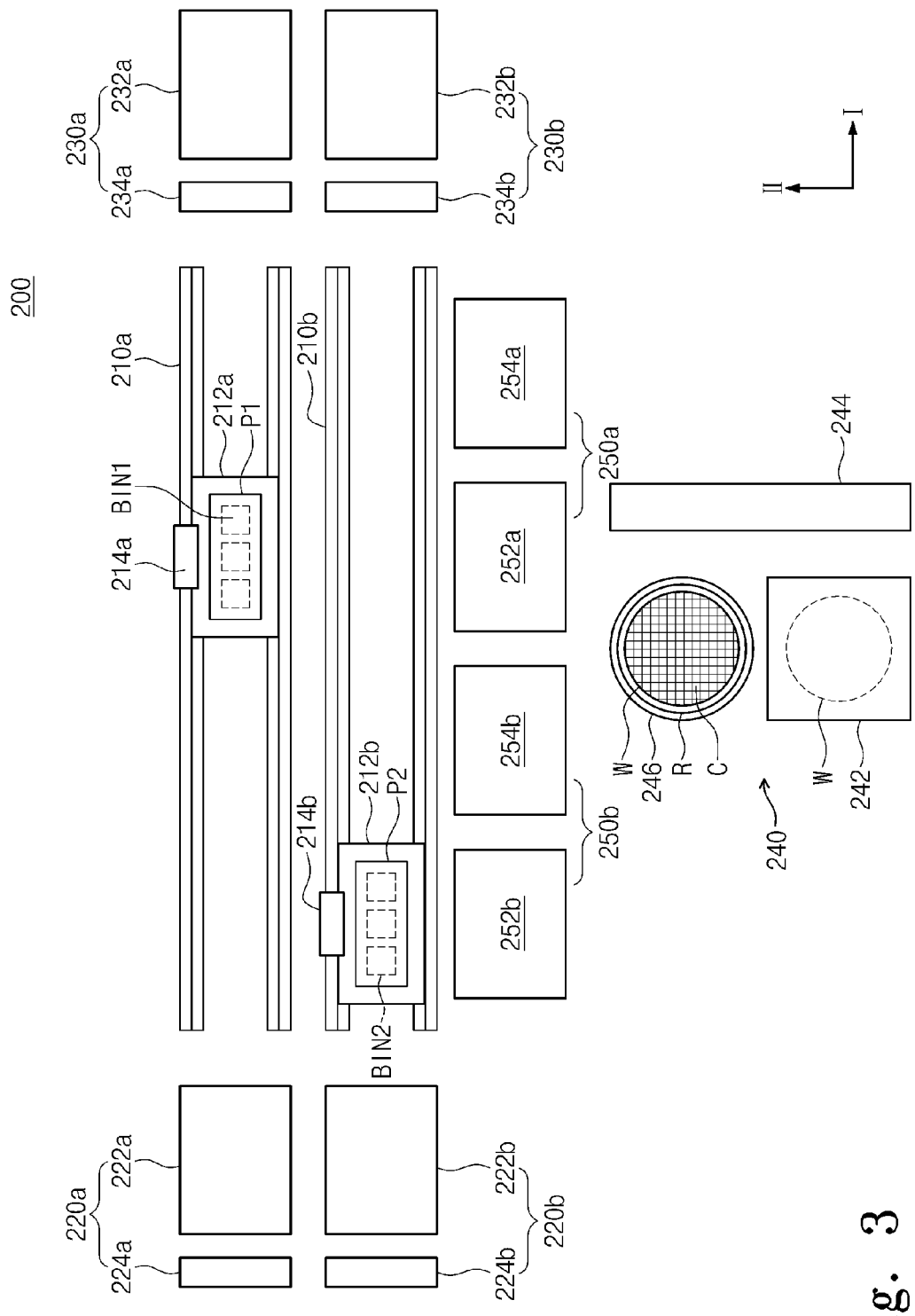
FIG. 3 is a plan view illustrating an apparatus for bonding a semiconductor chip according to some example embodiments.

FIG. 3 is a plan view illustrating an apparatus 200 for bonding a semiconductor chip according to some example embodiments. Referring to FIG. 3, the apparatus 200 for bonding a semiconductor chip includes first and second transfer rails 210a and 210b, first and second loading members 220a and 220b, first and second unloading members 230a and 230b, a first wafer supply unit 240, and first and second bonding units 250a and 250b.

Longitudinal directions of the first and second transfer rails 210a and 210b are parallel to a first direction I. The first and second transfer rails 210a and 210b may be parallel to each other and be spaced apart from each other in a second direction II perpendicular to the first direction I. First and second shuttles 212a and 212b on which first and second substrates P1 and P2 are set may be provided to the first and second transfer rails 210a and 210b, respectively. The first and second shuttles 212a and 212b may be linearly moved in the first direction I by first and second transfer grippers 214a and 214b respectively disposed on the first and second transfer rails 210a and 210b.

The first loading member 220a is disposed to be adjacent to one end of the first transfer rail 210a. The first loading member 220a includes a first supply container 222a and a first loader 224a. The first supply container 222a receives first substrates P1. Semiconductor chips will be bonded on the first substrates P1. The first loader 224a sequentially loads the first substrates P1 from the first supply container 222a onto the first transfer rail 210a. The first unloading member 230a is disposed to be adjacent to another end of the first transfer rail 210a. The first unloading member 230a includes a first receiving container 232a and a first unloader 234a. The first receiving container 232a receives the first substrates P1 on which the semiconductor chips are bonded. The first unloader 234a unloads the first substrates P1 having the bonded semiconductor chips from the first transfer rail 210a and then the first unloader 234a loads the first substrate P1 having the bonded semiconductor chips into the first receiving container 232a.

The second loading member 220b is disposed to be adjacent to one end of the second transfer rail 210b and loads second substrates P2 onto the second transfer rail 210b. The second unloading member 230b is disposed to be adjacent to another end of the second transfer rail 210b and unloads the second substrates P2 from the second transfer rail 210b. Elements of the second loading member 220b and the second unloading member 230b may be substantially the same as the elements of the first loading member 220a and the first unloading member 230a. Thus, detailed descriptions of the second loading member 220b and the second unloading member 230b will be omitted. Here, a reference numeral 222b is a second supply container, a reference numeral 224b is a second loader, a reference numeral 232b is a second receiving container, and a reference numeral 234b is a second unloader in FIG. 3.

The first wafer supply unit 240 supplies a wafer W including semiconductor chips C. The first wafer supply unit 240 may include a first wafer cassette 242, a transfer robot 244, and a first tape expander 246. The first wafer cassette 242, the transfer robot 244, and the first tape expander 246 may perform substantially the same functions as the first wafer cassette 142, the transfer robot 144, and the first tape expander 146 illustrated in FIG. 1, respectively. Thus, detailed descriptions of the first wafer cassette 242, the transfer robot 244, and the first tape expander 246 will be omitted.

The first and second bonding units 250a and 250b may be disposed between the second transfer rail 210b and the first wafer supply unit 240. The first and second bonding units 250a and 250b may be arranged in a line along the first direction I. The first bonding unit 250a bonds the semiconductor chips C to the first substrates P1. The first bonding unit 250a may include a first adhesive supplier 252a and a first die bonding tool 254a. The second bonding unit 250b bonds the semiconductor chips C to the second substrate P2. The second bonding unit 250b may include a second adhesive supplier 252b and a second die bonding tool 254b. The first and second adhesive suppliers 252a and 252b and the first and second die bonding tools 254a and 254b may perform substantially the same functions as the first and second adhesive suppliers 152a and 152b and the first and second die bonding tools 154a and 154b of FIG. 1. Thus, detailed descriptions of the first and second adhesive suppliers 252a and 252b and the first and second die bonding tools 254a and 254b will be omitted. In the present embodiment, the semiconductor chips may be bonded to the substrates using the adhesive. However, example embodiments are not limited thereto. In other example embodiments, for example, the semiconductor chips may be bonded to the substrates using an adhesive tape.

The apparatus 200 for bonding the semiconductor chip may classify good semiconductor chips according to tested grades and bond the classified good semiconductor chips to substrates different from each other, respectively. For the purpose of ease and convenience in explanation, the good semiconductor chips C may be classified into first chips BIN1 and second chips BIN2 according to the tested electrical characteristics.

The first loader 224a loads the first substrates P1 loaded in the first supply container 222a onto the first shuttle 212a disposed on the first transfer rail 210a. The second loader 224b loads the second substrates P2 loaded in the second supply container 222b onto the second shuttle 212b disposed on the second transfer rail 210b. The first transfer gripper 214a moves the first shuttle 212a on the first transfer rail 210a in the first direction I in order to face the first shuttle 212a toward the first adhesive supplier 252a. The second transfer gripper 214b moves the second shuttle 212b on the second transfer rail 210b in the first direction I in order to face the second shuttle 212b toward the second adhesive supplier 252b.

The first adhesive supplier 252a supplies an adhesive to the first substrates P1 loaded on the first shuttle 212a. The second adhesive supplier 252b supplies an adhesive to the second substrates P2 loaded on the second shuttle 212b.

The first transfer gripper 214a moves the first shuttle 212a on the first transfer rail 210a in the first direction I in order to face the first shuttle 212a toward the first die bonding tool 254a. The second transfer gripper 214b moves the second shuttle 212b on the second transfer rail 210b in the first direction I in order to face the second shuttle 212b toward the second die bonding tool 254b.

The first die bonding tool 254a picks up the first chips BIN1 from the wafer W and moves the first chips BIN1 onto the adhesive on the first substrate P1. And then the first die bonding tool 254a supplies pressure to the first chips BIN1 on the adhesive on the first substrate P1 so as to bond the first chips BIN1 to the first substrate P1. The second die bonding tool 254b picks up the second chips BIN2 from the wafer W and moves the second chips BIN2 onto the adhesive on the second substrate P2. And then the second die bonding tool 254b supplies pressure to the second chips BIN2 on the adhesive on the second substrate P2 so as to bond the second chips BIN2 to the second substrates P2.

Subsequently, the first transfer gripper 214a moves the first shuttle 212a in the first direction I. The second transfer gripper 214b moves the second shuttle 212b in the first direction I.

The first unloader 234a unloads the first substrates P1 having the bonded first chips BIN1 from the first transfer rail 210a and then loads the first substrate P1 into the first receiving container 232a. The second unloader 234b unloads the second substrates P2 having the bonded second chips BIN2 from the second transfer rail 210b and then loads the second substrate P2 into the second receiving container 232b.

Fourth Embodiment

Figure 4:
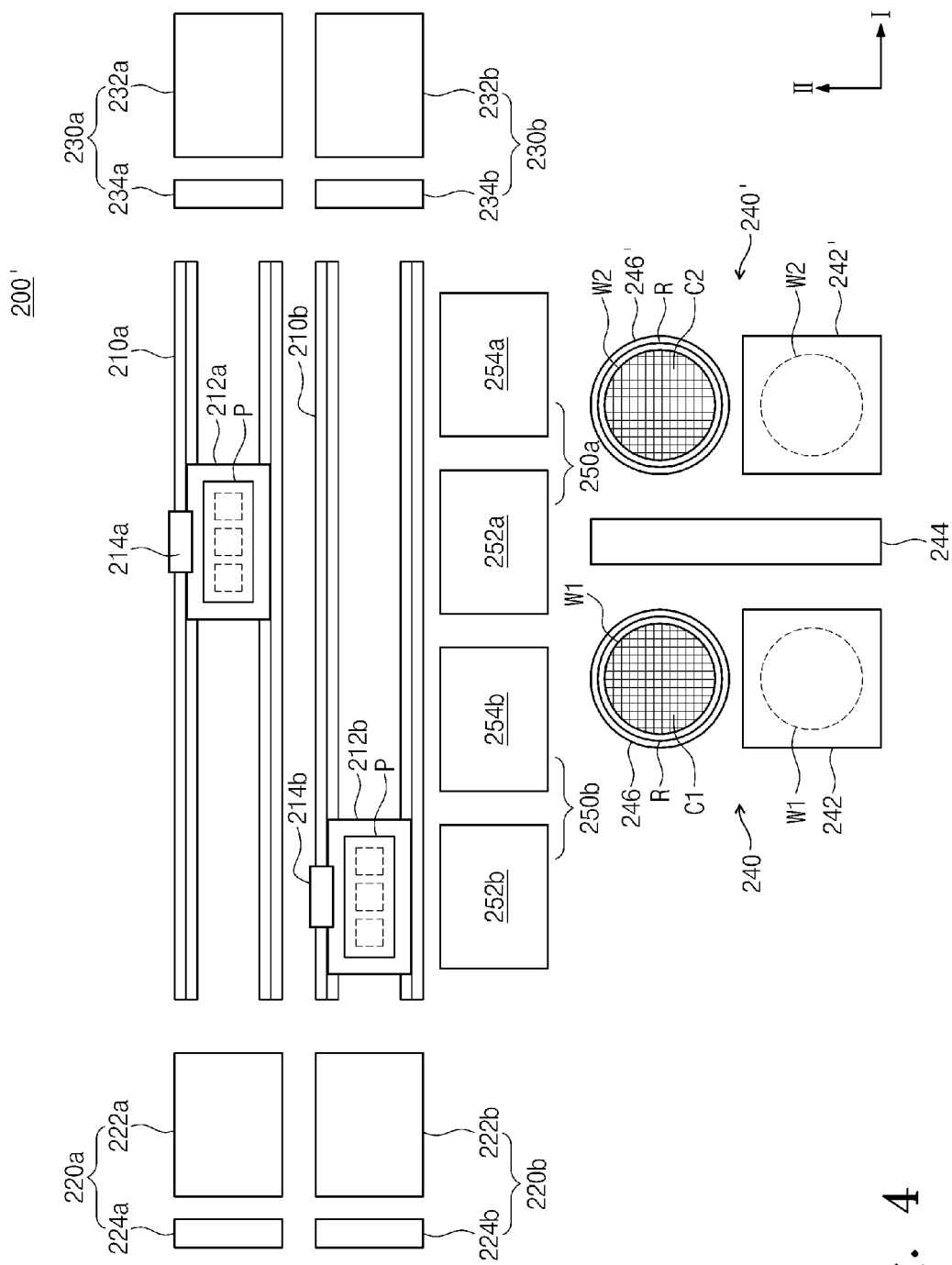
FIG. 4 is a plan view illustrating an apparatus for bonding a semiconductor chip according to some example embodiments.

FIG. 4 is a plan view illustrating an apparatus 200' for bonding a semiconductor chip according to some example embodiments. Hereinafter, for the purpose of the ease and convenience in explanation, the descriptions of the same elements as the apparatus 200 illustrated in FIG. 3 will be omitted or mentioned briefly.

Referring to FIG. 4, the first wafer supply unit 240 supplies a first wafer W1 including first semiconductor chips C1 and a second wafer supply unit 240' supplies a second wafer W2 including second semiconductor chips C2.

The second wafer supply unit 240' may include a second wafer cassette 242' and a second tape expander 246'. The second wafer cassette 242' may be set on a cassette supporter (not shown). The second wafer W2 is received inside the second wafer cassette 242'. The second wafer W2 may be withdrawn from the second wafer cassette 242' and then be set on the second tape expander 246' by the transfer robot 244. For easily picking up the second semiconductor chip C2 disposed on the second wafer W2, the second tape expander 246' may expand a wafer ring R in order to extend an ultraviolet tape for dicing.

The apparatus 200' for bonding the semiconductor chip may load the same kind of substrates P onto the first and second transfer rails 210a and 210b and then the apparatus 200' may stack the first semiconductor chips C1 and the second semiconductor chips C2 on the substrates P. This will be described in more detail.

The first loader 224a loads the substrates P disposed in the first supply container 222a onto the first shuttle 212a on the first transfer rail 210a. The second loader 224b loads the substrates P disposed in the second supply container 222b onto the second shuttle 212b on the second transfer rail 210b. The first transfer gripper 214a moves the first shuttle 212a on the first transfer rail 210a in the first direction I in order to face the first shuttle 212a toward the second adhesive supplier 252b. The second transfer gripper 214b moves the second shuttle 212b on the second transfer rail 210b in the first direction I in order to face the second shuttle 212b toward the second adhesive supplier 252b.

The second adhesive supplier 252b supply the adhesive to the substrates P loaded on the first shuttle 212a and the substrates P loaded on the second shuttle 212b.

The second die bonding tool 254b pick up the first semiconductor chips C1 from the first wafer W1 and move the first semiconductor chips C1 onto the adhesive on the substrates P loaded on the first and second shuttles 212a and 212b. And then the second die bonding tool 254b supply pressure to the first semiconductor chips C1 so as to bond the first semiconductor chips C1 to the substrates P loaded on the first and second shuttles 212a and 212b.

Subsequently, the first transfer gripper 214a moves the first shuttle 212a on the first transfer rail 210a in the first direction I in order to face the first shuttle 212a toward the first adhesive supplier 252a. The second transfer gripper 214b moves the second shuttle 212b on the second transfer rail 210b in the first direction I in order to face the second shuttle 212b toward the first adhesive supplier 252a.

The first adhesive supplier 252a supplies the adhesive to the first semiconductor chips C1 on the substrates P loaded on the first shuttle 212a and the first semiconductor chips C1 on the substrates P loaded on the second shuttle 212b.

The first die bonding tool 254a pick up the second semiconductor chips C2 from the second wafer W2 and move the second semiconductor chips C2 onto the adhesive on the first semiconductor chips C1 disposed on the first and second shuttles 212a and 212b. And then the first die bonding tool 254a supply pressure to the second semiconductor chips C2 so as to bond the second semiconductor chips C2 to the first semiconductor chips C1 disposed on the first and second shuttles 212a and 212b.

Subsequently, the first transfer gripper 214a moves the first shuttle 212a in the first direction I and the second transfer gripper 214b moves the second shuttle 212b in the first direction I.

The first unloader 234a unloads the substrates P having the stacked first and second semiconductor chips C1 and C2 from the first transfer rail 210a and then the first unloader 234a loads the substrates P into the first receiving container 232a. The second unloader 234b unloads the substrates P having the stacked first and second semiconductor chips C1 and C2 from the second transfer rail 210b and then the second unloader 234b loads the substrates P into the second receiving container 232b.

Alternatively, the apparatus 200' for bonding the semiconductor chip may load different kinds of substrates onto the first and second transfer rails 210a and 210b, respectively. Subsequently, the apparatus 200' may classify the first semiconductor chips C1 of the first wafer W1 according to characteristics thereof. And then the apparatus 200' may bond the classified first semiconductor chips C1 to the different kinds of the substrates, respectively. Subsequently, the apparatus 200' may stack the second semiconductor chips C2 of the second wafer W2 on the first semiconductor chips C1 bonded to the substrates.

Fifth Embodiment

Figure 5:
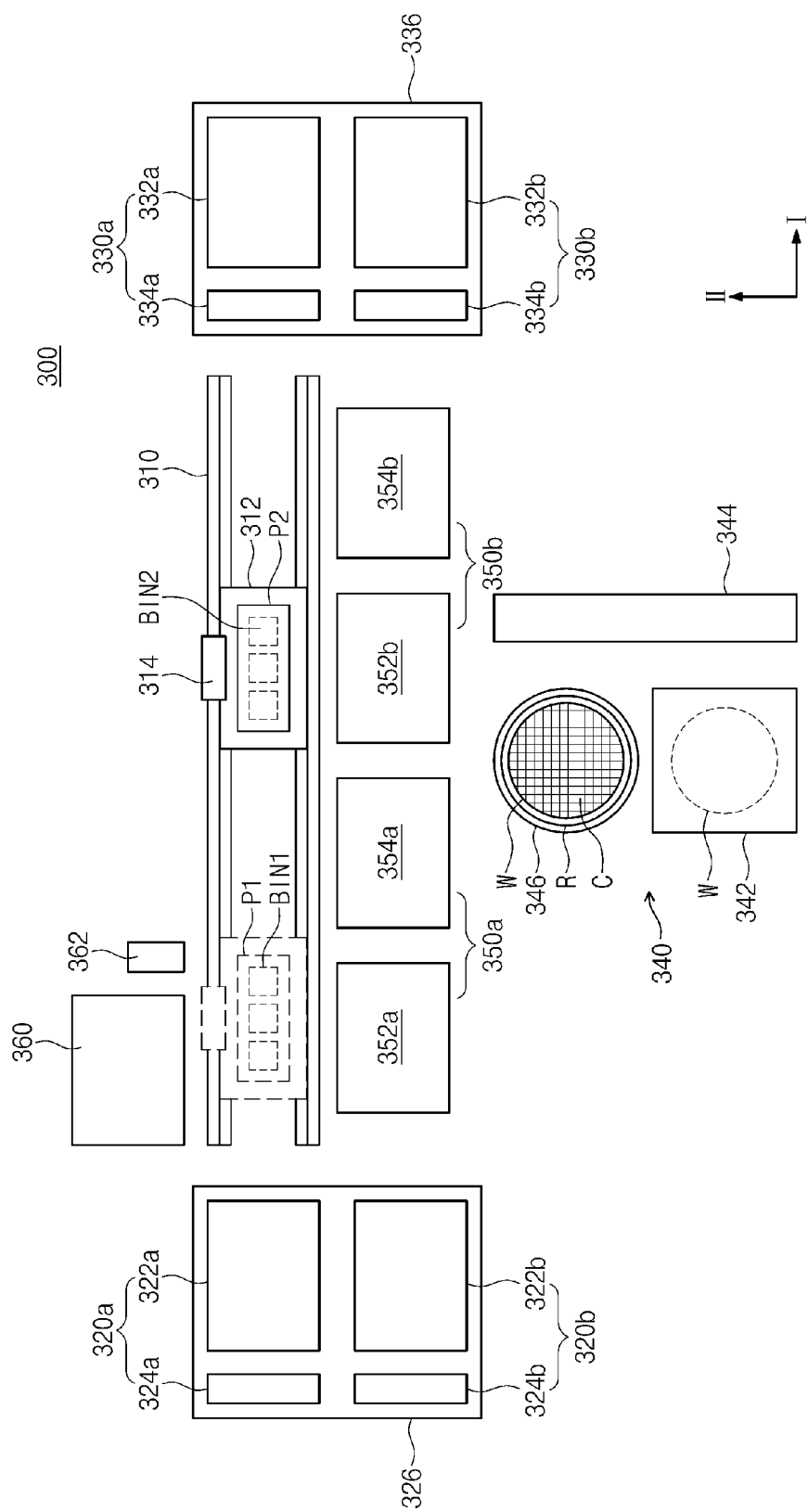
FIG. 5 is a plan view illustrating an apparatus for bonding a semiconductor chip according to some example embodiments.

FIG. 5 is a plan view illustrating an apparatus 300 for bonding a semiconductor chip according to some example embodiments. Referring to FIG. 5, the apparatus 300 includes a transfer rail 310, first and second loading members 320a and 320b, first and second unloading members 330a and 330b, a first wafer supply unit 340, first and second bonding units 350a and 350b, and a buffer member 360.

A longitudinal direction of the transfer rail 310 may be parallel to a first direction I. A shuttle 312 on which first and second substrates P1 and P2 are set may be provided to the transfer rail 310. The shuttle 312 is linearly moved in the first direction I by a transfer gripper 314 disposed on the transfer rail 310.

The first loading member 320a and the second loading member 320b may be disposed to be adjacent to the front of the transfer rail 310. The first loading member 320a and the second loading member 320b are spaced apart from each other in a second direction II perpendicular to the first direction I. The first and second loading member 320a and 320b may be disposed on a first transfer table 326. The first loading member 320a or the second loading member 320b may be aligned with the transfer rail 310 by movement of the first transfer table 326 in the second direction II. The first loading member 320a may load a first substrate P1 onto the transfer rail 310 in the state that the first loading member 320a is aligned with the transfer rail 310. The second loading member 320b may load a second substrate P2 onto the transfer rail 310 in the state that the second loading member 320b is aligned with the transfer rail 310.

The first loading member 320a includes a first supply container 322a and a first loader 324a. The first supply container 322a receives the first substrates P1. Semiconductor chips will be bonded on the first substrates P1. The first loader 324a loads the first substrates P1 from the first supply container 322a onto the transfer rail 310. The second loading member 320b includes a second supply container 322b and a second loader 324b. The second supply container 322b receives the second substrates P2. Semiconductor chips will be bonded on the second substrates P2. The second loader 324b loads the second substrates P2 from the second supply container 322b onto the transfer rail 310.

The first unloading member 330a and the second unloading member 330b may be disposed to be adjacent to the rear of the transfer rail 310. The first unloading member 330a and the second unloading member 330b are spaced apart from each other in the second direction II. The first and second unloading members 330a and 330b may be disposed on a second transfer table 336. The first unloading member 330a or the second unloading member 330b may be aligned with the transfer rail 310 by movement of the second transfer table 336 in the second direction II. The first unloading member 330a unloads the first substrate P1 from the transfer rail 310 in the state that the first unloading member 330a is aligned with the transfer rail 310. The second unloading member 330b unloads the second substrate P2 from the transfer rail 310 in the state that the second unloading member 330b is aligned with the transfer rail 310.

The first unloading member 330a includes a first receiving container 332a and a first unloader 334a. The first receiving container 332a receives the first substrates P1 on which the semiconductor chips are bonded. The first unloader 334a unloads the first substrates P1 having the bonded semiconductor chips from the transfer rail 310 and then the first unloader 334a loads the first substrate P1 having the bonded semiconductor chips into the first receiving container 332a. The second unloading member 330b includes a second receiving container 332b and a second unloader 334b. The second receiving container 332b receives the second substrates P2 on which the semiconductor chips are bonded. The second unloader 334b unloads the second substrates P2 having the bonded semiconductor chips from the transfer rail 310 and then the second unloader 334b loads the second substrate P2 having the bonded semiconductor chips into the second receiving container 332b.

The first wafer supply unit 340 supplies a wafer W including semiconductor chips C. The first wafer supply unit 340 may include a first wafer cassette 342, a transfer robot 344, and a first tape expander 346. The first wafer cassette 342, the transfer robot 344, and the first tape expander 346 may perform substantially the same functions as the first wafer cassette 142, the transfer robot 144, and the first tape expander 146 illustrated in FIG. 1, respectively. Thus, detailed descriptions of the first wafer cassette 342, the transfer robot 344, and the first tape expander 346 will be omitted.

The first and second bonding units 350a and 350b may be disposed between the transfer rail 310 and the first wafer supply unit 340. The first and second bonding units 350a and 350b may be arranged in a line along the first direction I. The first bonding unit 350a bonds the semiconductor chips C to the first substrates P1. The first bonding unit 350a may include a first adhesive supplier 352a and a first die bonding tool 354a. The second bonding unit 350b bonds the semiconductor chips C to the second substrate P2. The second bonding unit 350b may include a second adhesive supplier 352b and a second die bonding tool 354b. The first and second adhesive suppliers 352a and 352b and the first and second die bonding tools 354a and 354b may perform substantially the same functions as the first and second adhesive suppliers 152a and 152b and the first and second die bonding tools 154a and 154b of FIG. 1. Thus, detailed descriptions of the first and second adhesive suppliers 352a and 352b and the first and second die bonding tools 354a and 354b will be omitted. In the present embodiment, the first and second bonding units 350a and 350b may be provided to the apparatus 300. Alternatively, in other embodiments, one bonding unit may be provided to the apparatus 300. Additionally, in the present embodiment, the semiconductor chips may be bonded to the substrates using the adhesive. Alternatively, in other embodiments, the semiconductor chips may be bonded to the substrates using an adhesive tape.

The buffer member 360 may be disposed at a side of the transfer rail 310. For example, the buffer member 360 may be disposed on the opposite side of the first and second bonding units 350a and 350b with the transfer rail 310 as the center. Slots (not shown) receiving the first and second substrates P1 and P2 may be provided to the buffer member 360. A transferring tool 362 may be disposed to be adjacent to the buffer member 360. The transferring tool 362 loads the first and second substrates P1 and P2, which are loaded by the first and second loading members 320a and 320b, into the slots of the buffer member 360.

The apparatus 300 for bonding the semiconductor chip may classify good semiconductor chips according to tested grades and bond the classified good semiconductor chips to substrates different from each other, respectively. For the purpose of ease and convenience in explanation, the good semiconductor chips C may be classified into first chips BIN1 and second chips BIN2 according to the tested electrical characteristics.

The first loader 324a and the first supply container 322a are aligned with the transfer rail 310 by moving the first transfer table 326. The first loader 324a loads the first substrate P1 disposed in the first supply container 322a onto the shuttle 312 on the transfer rail 310. The transferring tool 362 loads the first substrate P1 loaded on the shuttle 312 into the buffer member 360. The second loader 324b and the second supply container 322b are aligned with the transfer rail 310 by moving the first transfer table 326. The second loader 324b loads the second substrate P2 disposed in the second supply container 322b onto the shuttle 312 on the transfer rail 310. The transferring tool 362 loads the second substrate P2 loaded on the shuttle 312 into the buffer member 360. By the methods described above, a plurality of the first substrates P1 and a plurality of second substrates P2 may be received in the buffer member 360.

The transferring tool 362 withdraws the first substrate P1 from the buffer member 360 and then loads the first substrate P1 onto the shuttle 312. The transfer gripper 314 moves the shuttle 312 on the transfer rail 310 in the first direction I in order to face the shuttle 312 to the first adhesive supplier 352a. The first adhesive supplier 352a supplies an adhesive on the first substrate P1 loaded in the shuttle 312.

The transfer gripper 314 moves the shuttle 312 on the transfer rail 310 in the first direction I in order to face the shuttle 312 to the first die bonding tool 354a. The first die bonding tool 354a picks up the first chips BIN1 from the wafer W and moves the first chip BIN1 onto the adhesive on the first substrate P1. And then the first die bonding tool 354a supplies pressure to the first chip BIN1 on the adhesive on the first substrate P1 so as to bond the first chips BIN1 to the first substrate P1.

The transfer gripper 314 moves the shuttle 312 on the transfer rail 310 in the first direction I. The first unloader 334a and the first receiving container 332a are aligned with the transfer rail 310 by moving the second transfer table 336. The first unloader 334a unloads the first substrate P1 having the bonded first chip BIN1 from the transfer rail 310 and then loads the first substrate P1 into the first receiving container 332a.

The transfer gripper 314 moves the shuttle 312 on the transfer rail 310 in a direction opposite to the first direction I, such that the shuttle 312 returns to an initial position. The transferring tool 362 withdraws the second substrate P2 from the buffer member 360 and then loads the second substrate P2 onto the shuttle 312. The transfer gripper 314 moves the shuttle 312 on the transfer rail 310 in the first direction I in order to face the shuttle 312 to the second adhesive supplier 352b. The second adhesive supplier 352b supplies the adhesive to the second substrate P2 loaded on the shuttle 312.

The transfer gripper 314 moves the shuttle 312 on the transfer rail 310 in the first direction I in order to face the shuttle 312 to the second die bonding tool 354b. The second die bonding tool 354b picks up the second chip BIN2 from the wafer W and moves the second chip BIN2 onto the adhesive on the second substrate P2. And then the second die bonding tool 354b supplies pressure to the second chip BIN2 on the adhesive on the second substrate P2 in order to bond the second chip BIN2 to the second substrate P2.

The transfer gripper 314 moves the shuttle 312 on the transfer rail 310 in the first direction I. The second unloader 334b and the second receiving container 332b are aligned with the transfer rail 310 by moving the second transfer table 336. The second unloader 334b unloads the second substrate P2 having the bonded second chip BIN2 and then loads the second substrate P2 into the second receiving container 332b.

Sixth Embodiment

Figure 6:
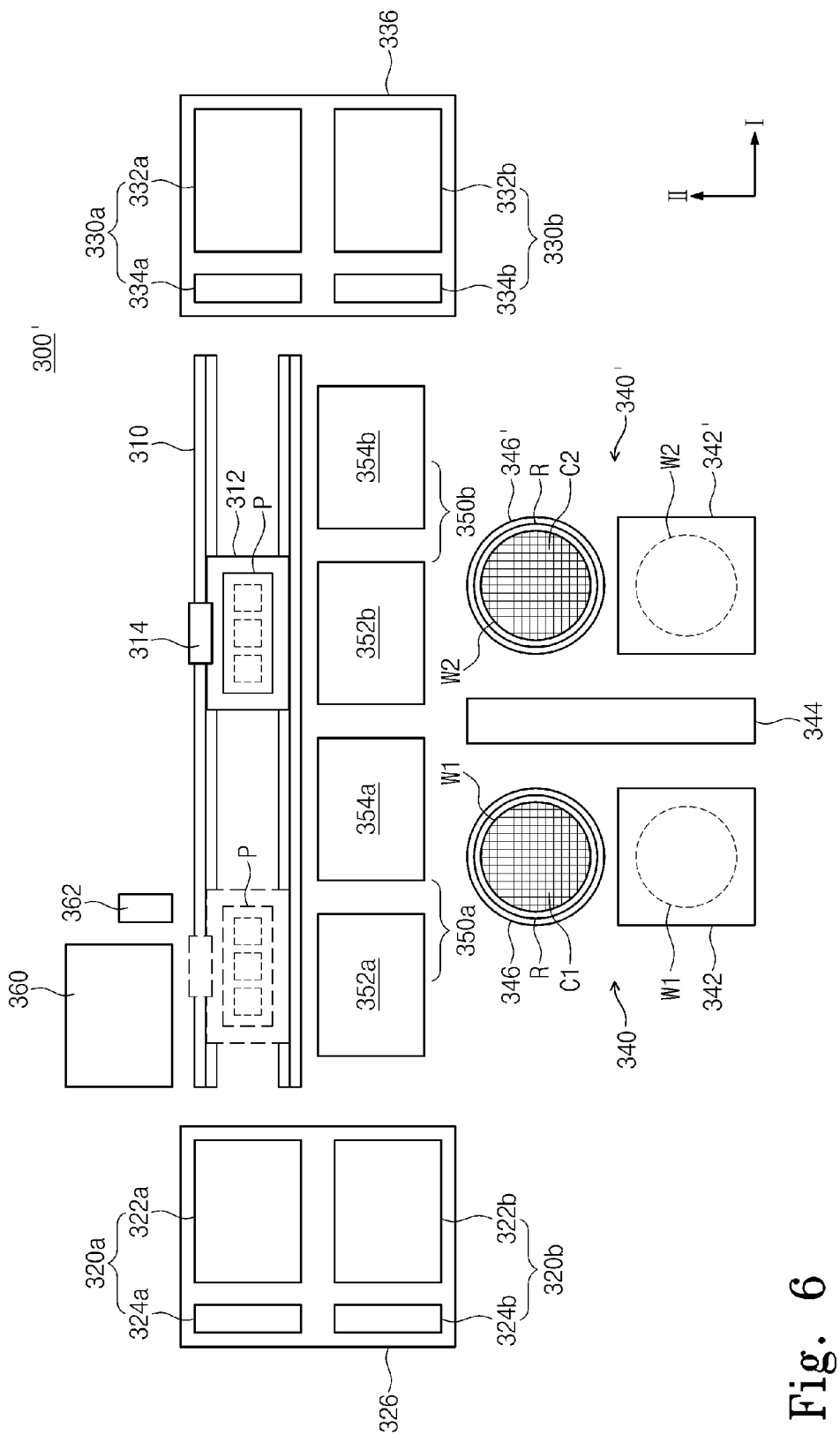
FIG. 6 is a plan view illustrating an apparatus for bonding a semiconductor chip according to some example embodiments.

FIG. 6 is a plan view illustrating an apparatus 300' for bonding a semiconductor chip according to some example embodiments. Hereinafter, for the purpose of the ease and convenience in explanation, the descriptions of the same elements as the apparatus 300 illustrated in FIG. 5 will be omitted or mentioned briefly.

Referring to FIG. 6, the first wafer supply unit 340 supplies a first wafer W1 including first semiconductor chips C1 and a second wafer supply unit 340' supplies a second wafer W2 including second semiconductor chips C2.

The second wafer supply unit 340' may include a second wafer cassette 342' and a second tape expander 346'. The second wafer cassette 342' may be set on a cassette supporter (not shown). The second wafer W2 is received inside the second wafer cassette 342'. The second wafer W2 may be withdrawn from the second wafer cassette 342' and then be set on the second tape expander 346' by the transfer robot 344. For easily picking up the second semiconductor chip C2 disposed on the second wafer W2, the second tape expander 346' may expand a wafer ring R in order to extend an ultraviolet tape for dicing.

The apparatus 300' for bonding the semiconductor chip may load the same kind of substrates P onto the transfer rail 310 and then the apparatus 300' may stack the first semiconductor chips C1 and the second semiconductor chips C2 on the substrates P. This will be described in more detail.

The first loader 324a and the first supply container 322a are aligned with the transfer rail 310 by the movement of the first transfer table 326. The first loader 324a loads the substrate P disposed in the first supply container 322a onto the shuttle 312 on the transfer rail 310. The transferring tool 362 loads the substrate P loaded on the shuttle 312 into the buffer member 360. The second loader 324b and the second supply container 322b are aligned with the transfer rail 310 by the movement of the first transfer table 326. The second loader 324b loads the substrate P disposed in the second supply container 322b onto the shuttle 312 on the transfer rail 310. The transferring tool 362 loads the substrate P loaded on the shuttle 312 into the buffer member 360. By the methods described above, a plurality of the substrates P may be received in the buffer member 360.

The transferring tool 362 withdraws the substrate P from the buffer member 360 and then loads the substrate P onto the shuttle 312. The transfer gripper 314 moves the shuttle 312 on the transfer rail 310 in the first direction I in order to face the shuttle 312 to the first adhesive supplier 352a. The first adhesive supplier 352a supplies an adhesive on the substrate P loaded in the shuttle 312.

The transfer gripper 314 moves the shuttle 312 on the transfer rail 310 in the first direction I in order to face the shuttle 312 to the first die bonding tool 354a. The first die bonding tool 354a picks up the first semiconductor chip C1 from the first wafer W1 and moves the first semiconductor chip C1 onto the adhesive on the substrate P. And then the first die bonding tool 354a supplies pressure to the first semiconductor chip C1 on the adhesive on the substrate P so as to bond the first semiconductor chip C1 to the substrate P.

The transfer gripper 314 moves the shuttle 312 on the transfer rail 310 in the first direction I in order to face the shuttle 312 to the second adhesive supplier 352b. The second adhesive supplier 352b supplies the adhesive to the first semiconductor chip C1 disposed on the substrate P loaded on the shuttle 312.

The transfer gripper 314 moves the shuttle 312 on the transfer rail 310 in the first direction I in order to face the shuttle 312 to the second die bonding tool 354b. The second die bonding tool 354b picks up the second semiconductor chip C2 from the second wafer W2 and moves the second semiconductor chip C2 onto the adhesive on the first semiconductor chip C1. And then the second die bonding tool 354b supplies pressure to the second semiconductor chip C2 on the adhesive on the first semiconductor chip C1 so as to stack the second semiconductor chip C2 on the first semiconductor chip C1.

The transfer gripper 314 moves the shuttle 312 on the transfer rail 310 in the first direction I. The first unloader 334a and the first receiving container 332a are aligned with the transfer rail 310 by the movement of the second transfer table 336. The first unloader 334a unloads the substrate P having the stacked first and second semiconductor chips C1 and C2 from the transfer rail 310 and then loads the substrate P into the first receiving container 332a.

The transfer gripper 314 moves the shuttle 312 on the transfer rail 310 in the direction opposite to the first direction I, such that the shuttle 312 returns to an initial position. The transferring tool 362 withdraws the substrate P from the buffer member 360 and then loads the substrate P onto the shuttle 312. Subsequently, the first and second semiconductor chips C1 and C2 are stacked on the substrate P by repeating the methods described above. The substrate P having the stacked first and second semiconductor chips C1 and C2 may be received into the first receiving container 332a of the first unloading member 330a or the second receiving container 332b of the second unloading member 330b.

Meanwhile, the apparatus 300' for bonding the semiconductor chip may load different kinds of substrates into the buffer member 360. Subsequently, the apparatus 300' may selectively load the different kinds of the substrate on the transfer rail 310. And then the apparatus 300' may classify the first semiconductor chips C1 of the first wafer W1 and then bond the classified first semiconductor chips C1 to the different kinds of the substrates, respectively. Additionally, the apparatus 300' may stack the second semiconductor chips C2 of the second wafer W2 on the first semiconductor chips C1, thereby forming multi-stack packages.

According to some example embodiments, packages respectively including chips with characteristics different from each other may be manufactured in one apparatus.

Additionally, a process of forming the multi-stack package may be simplified.

Furthermore, productivity of a semiconductor chip bonding process may be improved.

While example embodiments have been particularly shown and described, it will be understood by those of ordinary skill in the art that various changes in form and details may be made therein without departing from the spirit and scope of the present invention as defined by the following claims.

What is claimed is:

1. An apparatus for bonding semiconductor chips, the apparatus comprising:
    transfer rails configured to transfer substrates from a first end of the transfer rails to a second end of the transfer rails, and from the second end of the transfer rails to the first end of the transfer rails;
    loading members configured to load the substrates onto the first end of the transfer rails;
    unloading members configured to unload the substrates from the first end of the transfer rails;
    a first wafer supply unit configured to supply a first wafer including first semiconductor chips; and
    a bonding unit configured to bond the first semiconductor chips to the substrates, on the transfer rails, away from the first end of the transfer rails,
    wherein,
        the transfer rails include first and second transfer rails,
        the loading members include first and second loading members,
        the unloading members include first and second unloading members,
        the first loading member and the first unloading member make a first pair,
        the second loading member and the second unloading member make a second pair,
        the first pair is adjacent to a first end of the first transfer rail, and
        the second pair is adjacent to a first end of the second transfer rail.

2. The apparatus of claim 1, wherein a second end of the first transfer rail is adjacent to a second end of the second transfer rail.

3. The apparatus of claim 1, wherein the loading members are further configured to load different kinds of the substrates onto the first end of the first and second transfer rails,
    wherein the first semiconductor chips are classified according to characteristics of the first semiconductor chips, and
    wherein the bonding unit is further configured to bond the classified first semiconductor chips to the different kinds of the substrates.

4. The apparatus of claim 1, wherein the loading members are further configured to load a same kind of the substrates onto the first end of the first and second transfer rails, and
    wherein when the bonding unit bonds the first semiconductor chips to the substrates loaded on a first one of the first and second transfer rails, one of the substrates loaded on a second one of the first and second transfer rails is standing by ready.

5. The apparatus of claim 1, further comprising:
    a second wafer supply unit configured to supplying a second wafer including second semiconductor chips;
    wherein the loading members are further configured to load a same kind of the substrates onto the first end of the first and second transfer rails, and
    wherein the bonding unit is further configured to stack the first semiconductor chips and the second semiconductor chips on the substrates.

6. The apparatus of claim 1, further comprising:
    a second wafer supply unit configured to supplying a second wafer including second semiconductor chips;
    wherein the loading members are further configured to load different kinds of the substrates onto the first end of the first and second transfer rails,
    wherein the first semiconductor chips are classified according to characteristics of the first semiconductor chips, and
    wherein the bonding unit is further configured to bond the classified first semiconductor chips to the different kinds of the substrates, and then the bonding unit is further configured to bond the second semiconductor chips to the first semiconductor chips.

7. The apparatus of claim 1, wherein the first and second transfer rails are continuous from the first end of the first and second transfer rails to the second end of the first and second transfer rails.

8. The apparatus of claim 1, wherein the first and second transfer rails comprise a pair of parallel transfer rails.

9. The apparatus of claim 1, further comprising:
a buffer member at one side of at least one of the first and second transfer rails, the buffer member configured to hold the substrates,
wherein the bonding unit further comprises first and second bonding units configured to bond the first semiconductor chips and second semiconductor chips to the substrates on the transfer rails, respectively.

10. The apparatus of claim 9, wherein the loading members are configured to load different kinds of the substrates onto the first and second transfer rails via the buffer member,
wherein the first semiconductor chips are classified according to characteristics of the first semiconductor chips, and
wherein when the first bonding unit bonds one of the classified first semiconductor chips to a first kind of the substrates, the buffer member is further configured to temporarily receive a second kind of the substrates.

11. The apparatus of claim 9, further comprising:
wherein the loading members are further configured to load a same kind of the substrates onto the first and second transfer rails via the buffer member, and
wherein the first and second bonding units are further configured to stack the first semiconductor chips and the second semiconductor chips on the substrates.

12. The apparatus of claim 9, further comprising:
a transferring tool configured to transfer the substrates from the first and second transfer rails to the buffer member after the loading of the substrates onto the first and second transfer rails, and configured to transfer the substrates from the buffer member to the first and second transfer rails after the transferring of the substrates to the buffer member.

13. An apparatus for bonding semiconductor chips, the apparatus comprising:
first and second transfer rails configured to transfer substrates;
a first loading member configured to load the substrates onto the first transfer rail;
a second loading member configured to load the substrates onto the second transfer rail;
a first unloading member configured to unload the substrates from the first transfer rail;
a second unloading member configured to unload the substrates from the second transfer rail;
a first wafer supply unit configured to supply a first wafer including first semiconductor chips; and
a bonding unit configured to bond the first semiconductor chips to the substrates on the first and second transfer rails;
wherein the first transfer rail and the second transfer rail are in line with each other,
wherein the first loading member and the first unloading member are near a same end of the first transfer rail, and
wherein the second loading member and the second unloading member are near a same end of the second transfer rail.

14. The apparatus of claim 13, further comprising:
a second wafer supply unit configured to supply a second wafer including second semiconductor chips;
wherein the bonding unit is further configured to bond the second semiconductor chips to the first semiconductor chips.

15. The apparatus of claim 13, further comprising:
a second wafer supply unit configured to supply a second wafer including second semiconductor chips;
wherein the bonding unit is further configured to stack the first semiconductor chips and the second semiconductor chips on the substrates.

16. The apparatus of claim 13, wherein,
the bonding unit is configured to bond the first semiconductor chips to the substrates on the first transfer rail near a first end of the first transfer rail, and configured to bond the first semiconductor chips to the substrates on the second transfer rail near a first end of the second transfer rail,
the first end of the first transfer rail is near the first end of the second transfer rail,
the first loading member and the first unloading member are near a second end of the first transfer rail, and
the second loading member and the second unloading member are near a second end of the second transfer rail.

17. The apparatus of claim 16, wherein a direction from the first end of the first transfer rail to the second end of the first transfer rail is a same direction as a direction from the second end of the second transfer rail to the first end of the second transfer rail.

18. The apparatus of claim 13, further comprising
a buffer member at one side of at least one of the first and second transfer rails, the buffer member configured to hold the substrates
wherein the bonding unit further comprises first and second bonding units configured to bond the first semiconductor chips and second semiconductor chips to the substrates on the first and second transfer rails, respectively.

19. The apparatus of claim 18, wherein the first and second loading members are configured to load different kinds of the substrates onto the first and second transfer rails via the buffer member,
wherein the first semiconductor chips are classified according to characteristics of the first semiconductor chips, and
wherein when the first bonding unit bonds one of the classified first semiconductor chips to a first kind of the substrates, the buffer member is further configured to temporarily receive a second kind of the substrates.

20. The apparatus of claim 18, further comprising:
wherein the first and second loading members are further configured to load a same kind of the substrates onto the first and second transfer rails via the buffer member, and
wherein the first and second bonding units are further configured to stack the first semiconductor chips and the second semiconductor chips on the substrates.

* * * * *